US010424682B2

(12) United States Patent
Naumovitz et al.

(10) Patent No.: US 10,424,682 B2
(45) Date of Patent: Sep. 24, 2019

(54) MULTILAYER DOWN-CONVERTING ENCAPSULANT FILMS AND ELECTRONIC DEVICES INCLUDING THE SAME

(71) Applicants: Dow Global Technologies LLC, Midland, MI (US); Rohm and Haas Company, Philadelphia, PA (US)

(72) Inventors: John A. Naumovitz, Midland, MI (US); Hongyu Chen, Zhangjiang (CN); Yan Huang, Shanghai (CN); Ada Yu Zhang, Shanghai (CN); Zhi Xu, Pudong New District (CN)

(73) Assignees: DOW GLOBAL TECHNOLOGIES LLC, Midland, MI (US); ROHM AND HAAS COMPANY, Philadelphia, PA (US)

( * ) Notice: Subject to any disclaimer, the term of this patent is extended or adjusted under 35 U.S.C. 154(b) by 7 days.

(21) Appl. No.: 15/032,168

(22) PCT Filed: Nov. 4, 2013

(86) PCT No.: PCT/CN2013/086510
§ 371 (c)(1),
(2) Date: Apr. 26, 2016

(87) PCT Pub. No.: WO2015/062108
PCT Pub. Date: May 7, 2015

(65) Prior Publication Data
US 2016/0260857 A1    Sep. 8, 2016

(51) Int. Cl.
*H01L 31/055* (2014.01)
*B32B 27/08* (2006.01)
*C09K 11/06* (2006.01)
*H01L 31/048* (2014.01)
*C09K 11/02* (2006.01)
*B32B 27/18* (2006.01)
*B32B 27/32* (2006.01)
*B32B 27/20* (2006.01)
*B32B 27/30* (2006.01)
*H01L 31/0296* (2006.01)
*H01L 31/032* (2006.01)

(52) U.S. Cl.
CPC ............ *H01L 31/055* (2013.01); *B32B 27/08* (2013.01); *B32B 27/18* (2013.01); *B32B 27/20* (2013.01); *B32B 27/306* (2013.01); *B32B 27/308* (2013.01); *B32B 27/32* (2013.01); *C09K 11/02* (2013.01); *C09K 11/06* (2013.01); *H01L 31/0296* (2013.01); *H01L 31/0322* (2013.01); *H01L 31/048* (2013.01); *H01L 31/0481* (2013.01); *B32B 2264/00* (2013.01); *B32B 2307/206* (2013.01); *B32B 2307/422* (2013.01); *B32B 2307/72* (2013.01); *B32B 2307/7246* (2013.01); *B32B 2457/00* (2013.01); *B32B 2457/12* (2013.01); *C09K 2211/1007* (2013.01); *C09K 2211/1092* (2013.01); *C09K 2211/182* (2013.01); *Y02E 10/52* (2013.01); *Y02E 10/541* (2013.01)

(58) Field of Classification Search
CPC . H01L 31/055; H01L 31/048; H01L 31/0481; Y02E 10/50
USPC .................................................. 136/252, 257
See application file for complete search history.

(56) References Cited

U.S. PATENT DOCUMENTS

| | | | |
|---|---|---|---|
| 5,672,643 A | 9/1997 | Burns et al. | |
| 6,514,594 B1 | 2/2003 | Wei et al. | |
| 8,222,335 B2 | 7/2012 | Kanesato et al. | |
| 2006/0169971 A1 | 8/2006 | Cho et al. | |
| 2007/0295383 A1 | 12/2007 | Li et al. | |
| 2010/0038521 A1 | 2/2010 | Clark et al. | |
| 2010/0139749 A1* | 6/2010 | Mapel | C03C 3/102 136/255 |
| 2010/0243053 A1 | 9/2010 | Coe-Sullivan et al. | |
| 2011/0139218 A1 | 6/2011 | Hanoka et al. | |
| 2012/0119639 A1 | 5/2012 | Staats et al. | |
| 2012/0204952 A1 | 8/2012 | Kim et al. | |
| 2012/0305075 A1* | 12/2012 | Ford | H01L 31/03529 136/257 |
| 2013/0074929 A1* | 3/2013 | Shimoi | A01G 9/1438 136/257 |
| 2013/0125985 A1 | 5/2013 | Sawaki et al. | |
| 2013/0269776 A1 | 10/2013 | Wu et al. | |
| 2014/0007940 A1* | 1/2014 | Wu | B32B 17/10669 136/257 |

FOREIGN PATENT DOCUMENTS

| | | |
|---|---|---|
| CN | 102093628 A | 6/2011 |
| CN | 102185019 A | 9/2011 |
| CN | 102559079 A | 7/2012 |
| CN | 102632611 A | 8/2012 |
| CN | 102965039 A | 3/2013 |
| JP | H07-202243 A | 8/1995 |
| JP | 2006303033 A | 11/2006 |
| JP | 2007230955 A | 9/2007 |
| JP | 2008195674 A | 8/2008 |

(Continued)

*Primary Examiner* — Lindsey A Bernier
(74) *Attorney, Agent, or Firm* — Husch Blackwell LLP

(57) ABSTRACT

A multilayer encapsulant film having at least two layers includes a first layer comprising an encapsulant resin, and a second layer comprising an encapsulant resin and at least one down-converter, such as a rare-earth organometallic complex. The down-converter may be present in an amount of at least 0.0001 wt % based on the total weight of the encapsulant film. Further layers of a multilayer encapsulant film may or may not include a down-converter. Preferably, a multilayer encapsulant film contains at least one layer with at least one down-converter and at least one layer without a down-converter. Such multilayer down-converting films may be used in an electronic device, such as a PV module.

20 Claims, No Drawings

(56) References Cited

FOREIGN PATENT DOCUMENTS

| | | | |
|---|---|---|---|
| JP | 2012-015205 A | 1/2012 | |
| JP | 2013-079179 A | 5/2013 | |
| WO | 2009/157879 A1 | 12/2009 | |
| WO | WO 2009157879 A1 * | 12/2009 | ............. C09K 11/06 |
| WO | WO-2011149028 A1 * | 12/2011 | ........... A01G 9/1438 |
| WO | WO 2012134992 A2 * | 10/2012 | ....... B32B 17/10669 |

* cited by examiner

MULTILAYER DOWN-CONVERTING ENCAPSULANT FILMS AND ELECTRONIC DEVICES INCLUDING THE SAME

FIELD OF THE INVENTION

In one aspect the invention relates to multilayer encapsulant films, while in another aspect, the invention relates to increasing solar cell efficiency using a down-converting encapsulant film.

BACKGROUND OF THE INVENTION

Encapsulant films used in PV modules have several requirements, including good adhesion to various components, the ability to protect the PV module and solar cells and prevent moisture penetration to the cells, and good electrical insulation. In addition, encapsulant films must permit maximum light passage to the solar cells to maximize power generation.

All cell materials have some limitations when it comes to the wavelengths the materials can effectively convert to electricity. For example, some portions in the UV region and IR region cannot be effectively converted into electrical power. This is wasted energy.

In order to capture this wasted energy, materials which up-convert or down-convert otherwise unusable wavelengths to usable wavelengths are desired. For example, down-converting materials take UV-wavelength photons and convert them to longer wavelengths that can be used by the solar cells. Similarly, up-converting materials take IR-region photons and covert them to shorter wavelengths that can be used by the solar cells. These converting materials, however, have efficiency and cost limitations. Such up-converting and down-converting materials typically have lower optical transmission in the useful spectrum or require such a large amount of additives that it is not cost-effective to implement the films.

A need exists for low cost encapsulant films that down-convert unused UV wavelengths to lower energy photons which could be absorbed by a PV cell to increase cell efficiency and reduce module temperature.

SUMMARY OF THE INVENTION

In one embodiment, the present invention is a multilayer encapsulant film comprising at least two layers. A first layer comprises an encapsulant resin, and a second layer comprises an encapsulant resin and at least one down-converter, such as a rare-earth organometallic complex. The down-converter may be present in an amount of at least 0.0001 wt % based on the total weight of the encapsulant film.

In another embodiment, the present invention is a multi-layer encapsulant film having at least three layers with one layer comprising an encapsulant resin and at least one down-converter (i.e., rare-earth organometallic complex) and at least one layer comprising an encapsulant resin and no down-converter. Further layers of a multilayer encapsulant film may or may not include a down-converter. The total amount of down-converter in a multilayer encapsulant film may be at least 0.0001 wt % based on the total weight of the encapsulant film.

In another embodiment, the present invention is an electronic device, such as a PV module, including a multilayer encapsulant film having at least one PV cell. A first layer of the multilayer film includes an encapsulant resin, and a second layer includes an encapsulant resin and at least one down-converter, such as a rare-earth organometallic complex. The down-converter may be present in an amount of at least 0.0001 wt % based on the total weight of the encapsulant film.

DETAILED DESCRIPTION OF THE PREFERRED EMBODIMENT

Definitions

The numerical ranges in this disclosure are approximate, and thus may include values outside of the range unless otherwise indicated. Numerical ranges include all values from and including the lower and the upper values, in increments of one unit, provided that there is a separation of at least two units between any lower value and any higher value. As an example, if a compositional, physical or other property, such as, for example, molecular weight, viscosity, melt index, etc., is from 100 to 1,000, it is intended that all individual values, such as 100, 101, 102, etc., and sub ranges, such as 100 to 144, 155 to 170, 197 to 200, etc., are expressly enumerated. For ranges containing values which are less than one or containing fractional numbers greater than one (e.g., 1.1, 1.5, etc.), one unit is considered to be 0.0001, 0.001, 0.01 or 0.1, as appropriate. For ranges containing single digit numbers less than ten (e.g., 1 to 5), one unit is typically considered to be 0.1. These are only examples of what is specifically intended, and all possible combinations of numerical values between the lowest value and the highest value enumerated are to be considered to be expressly stated in this disclosure. Unless stated to the contrary, implicit from the context, or customary in the art, all parts and percentages are by weight.

"Comprising", "including", "having" and like terms are not intended to exclude the presence of any additional component, step or procedure, whether or not the same is specifically disclosed. In order to avoid any doubt, all processes claimed through use of the term "comprising" may include one or more additional steps, pieces of equipment or component parts, and/or materials unless stated to the contrary. In contrast, the term, "consisting essentially of" excludes from the scope of any succeeding recitation any other component, step or procedure, excepting those that are not essential to operability. The term "consisting of" excludes any component, step or procedure not specifically delineated or listed. The term "or", unless stated otherwise, refers to the listed members individually as well as in any combination.

"Direct contact" is a configuration whereby a first layer, film or component immediately contacts a second layer, film or component with no intervening layer(s) and/or no intervening material(s) located between the layers, films or components.

As used herein, the term "encapsulant" refers to polyolefin-based films used as encapsulation layers in PV modules.

As used herein, the term "electronic device" refers to any device having an electronic component enclosed between at least two film layers. Electronic devices include, for example, liquid crystal panels, solar cells, photovoltaic cells, photovoltaic modules, electro-luminescent devices and plasma display units.

"Interpolymer" means a polymer prepared by the polymerization of at least two different types of monomers. This generic term includes copolymers, usually employed to refer to polymers prepared from two different types of monomers, and polymers prepared from more than two different types of monomers, e.g., terpolymers, tetrapolymers, etc.

As used herein, the term "multilayer" refers to a structure having at least two layers. For example, the term "multilayer," when used in reference to a film structure, includes films having at least two, at least three, and at least four layers.

"Polyolefin", "PO" and like terms mean a polymer derived from simple olefins. Many polyolefins are thermoplastic and for purposes of this invention, can include a rubber phase. Representative polyolefins include polyethylene, polypropylene, polybutene, polyisoprene and their various interpolymers.

Multilayer Down-Converting Encapsulant Films

In one aspect, a multilayer down-converting encapsulant film having at least two layers and down-converters at least one layer is provided. In an embodiment, the multilayer down-converting encapsulant film is a two-layer film. Such a two-layer down-converting encapsulant film includes only two layers, each comprising at least one encapsulant resin and optionally additives, such as, for example, compatibilizers, UV stabilizers, and functionalization for glass adhesion. At least one layer of the two-layer down-converting encapsulant film includes at least one down-converter. Preferably, only one layer of a two-layer down-converting encapsulant film will contain the at least one down-converter. More than one encapsulant resin may be used in a single layer of a two-layer down-converting encapsulant film.

In another aspect, a multilayer down-converting encapsulant film having at least three layers and down-converters in at least one layer is provided. Each layer in such a multilayer down-converting encapsulating film having at least three layers comprises at least one encapsulant resin and optionally, additives, such as, for example, compatibilizers and UV stabilizers. At least one down-converter is provided in at least one of the layers. Preferably, at least one layer of a multilayer down-converting encapsulant film having at least three layers does not include a down-converter. More preferably, at least two layers of a multilayer down-converting encapsulant film having at least three layers does not include a down-converter. More than one encapsulant resin may be used in a single layer of a multilayer down-converting encapsulant film having at least three layers.

In some embodiments, layers in addition to the encapsulant resin layers may be included in the multilayer encapsulant films according to any of the embodiments described herein.

In any of the embodiments of a multilayer down-converting encapsulant film described herein, the film may contain at least 90 weight percent (wt %) encapsulant resin, preferably at least 95 wt % and more preferably at least 98 wt % encapsulant resin, based on total weight of the down-converting encapsulant film. At most, the total amount of encapsulant resin in any embodiment of a down-converting encapsulant film described herein may be 99.999 wt %, based on the total weight of the down-converting encapsulant film. This includes amounts from 90 wt % to 99.999 wt %, 95-99.999 wt % and 98-99.999 wt % encapsulant resin.

The multilayer down-converting encapsulant films according to any embodiment disclosed herein may contain at least 0.0001 wt %, preferably at least 0.001 wt % and more preferably at least 0.01 wt % of at least one down-converter, based on the total weight of the down-converting encapsulant film. At most, the down-converter may be present in an amount of 10 wt %, preferably 5 wt % and more preferably 2 wt %, based on the total weight of the down-converting encapsulant film. This includes ranges from 0.0001-10 wt %, 0.001-5 wt % and 0.01-2 wt %. In embodiments using more than one down-converter, the total amount of down-converter may be at least 0.0001 wt %, preferably at least 0.001 wt % and more preferably at least 0.01 wt %, based on the total weight of the down-converting encapsulant film. At most, the total amount of all down-converters present in a multilayer film as described herein may be present in an amount of 10 wt %, preferably 5 wt % and more preferably 2 wt %, based on the total weight of the down-converting encapsulant film. This includes ranges from 0.0001-10 wt %, 0.001-5 wt % and 0.01-2 wt %.

When other additives are used in a multilayer down-converting encapsulant film, the additives may be used in the known and standard amounts recommended in the art. Typically, the total amount of additive used is no greater than 10 wt %, preferably no greater than 5 wt %, and more preferably no greater than 2 wt %.

Multilayer down-converting films may be made by coextrusion, lamination of individual layers, or extrusion coating of one material onto a base film. In one embodiment, the multilayer down-converting films are made by coextrusion or lamination.

Encapsulant Resin

In any of the multilayer down-converting encapsulant films disclosed above, the encapsulant resin may be the same or different polymers. Suitable polymers for use as the encapsulant resin may include, for example, ethylene alpha-olefin copolymer resins, EVA resins, acrylate copolymers, ionomers, silicones or other known encapsulant materials. Encapsulant resins may include silane or other modifications for improved glass adhesion, crosslinking or other desired functionality.

Preferably, the encapsulant resin is a polyolefin copolymer. Polyolefin copolymers useful in a multilayer down-converting encapsulant film according to any embodiment described herein include, but are not limited to, polyolefin interpolymers or copolymers and, more preferably, ethylene alpha-olefin interpolymers. Preferred alpha-olefins for use in the present invention are designated by the formula $CH_2=CHR^*$, where $R^*$ is a linear or branched alkyl group of from 1 to 12 carbon atoms. Examples of suitable α-olefins include, but are not limited to, propylene, isobutylene, 1-butene, 1-pentene, 1-hexene, 4-methyl-1-pentene, and 1-octene. One particularly preferred α-olefin is propylene.

Down-Converters

In any of the embodiments described herein, at least one down-converter is provided in at least one layer of the multilayer down-converting encapsulant films. Down-converters are rare-earth organic complexes which can convert short wavelength light to longer wavelength light. Preferably, down-converters useful in the present invention have strong absorption in the UV range of about 200-550 nm, preferably 225-500 nm, and give off emissions from about 400-1,200 nm, preferably 500-900 nm, and most preferably 600-800 nm.

Suitable down-converters for use in the present invention include rare-earth organometallic complexes which absorb UV light and give off red light with high efficiency. As used herein, an electronic device including a layer with a down-converter as disclosed herein has high efficiency when the electronic device exhibits an increase in absolute module efficiency of greater than 0.05% compared to a comparable electronic device identical to the electronic device except in that the comparable electronic device does not include a down-converter, or rare-earth organometallic complex. For example, high efficiency may be characterized by an increase in absolute module efficiency of greater than 0.05%, or an increase in absolute module efficiency of at least 0.07%, at least 0.08% or at least 0.09%, compared to a comparable electronic device identical to the electronic device except in that the comparable electronic device does not include a down converter. In some embodiments, high efficiency may be characterized by an increase in absolute module efficiency of at least 0.1% compared to a comparable electronic device as described above. As used herein, absolute module efficiency is determined by placing the films on the solar cell and recording the current-voltage (IV) characteristic curve using a Class AAA (AM 1.5 reference spectral irradiance) solar simulator. The percent efficiency (% Eff) is calculated as the maximum power generated by the solar cell (W) divided by the total solar irradiance (1000 W/m$^2$ times the solar cell area (m$^2$)).

These down-converters, or rare-earth organic metal complexes, can be doped into encapsulant resins and formed into a multilayer encapsulant film with no visible light absorption. More than one type of down-converter may be present in a given layer of a multilayer down-converting encapsulant film and, in some embodiments, different down-converters may be provided in different layers of a down-converting encapsulant film, especially when the down-converting encapsulant film is a multilayer film containing at least three layers.

Rare-earth ions useful in a down-converter include, but not limited to, Europium (Eu), terbium (Tb), lanthanum (La), cerium (Ce), praseodymiu (Pr), neodymium (Nd), promethium (Pm), samarium (Sm), dysprosium (Dy), holmium (Ho), erbium (Er), thulium™ and ytterbium (Yb). These rare-earth ions may be complexed to various ligands to product rare-earth organic complexes suitable for use as down-converters in the present two-layer and multilayer down-converting encapsulant films. Suitable ligands include, but are not limited to, β-diketone based materials, such as dibenzoylmethane; thenoyltrifluoacetone; acytylacetone; 1,3-diphenyl-1,3-propane dione; acetylacetone; benzoylacetone; di-benzoyl acetone; diiso butyroyl methane; 3-methyl pentane-2,4-dione; 2,2-dimethyl pentane-3,5-dione; 2-methyl-1,3-butane dione; 1,3-butane dione; 3-phenyl-2,4-pentane dione; 1,1,1-trifluoro 2,4-pentane dione; 1,1,1-trifluoro-5,5-dimethyl-2,4-hexane dione; 2,2,6,6-tetramethyl-3,5-heptane dione; 3-methyl-2,4-pentane dione; 1,3 -diphenyl-2-methyl-1,3-propane dione; and 1 -ethoxy-1,3-butane dione.

Hydroxyl acids can also be employed as ligands. Other ligands include trioctylamine, trioctylphosphine oxide (TOPO), bipyridyl, tricaprylylmethylammonium chloride, triisooctylamine, 1,10-phenanthroline, and aromatic compounds (such as salicyclic acid and benzoic acid).

An exemplary Eu complex is Eu(TTA)$_3$bipy, wherein TTA is thenoyltrifluoacetone and bipy is bipyridyl. This complex has strong absorption in the UV range from 250 nm to 450 nm and give off strong red emission of 612 nm. Another exemplary Eu complex is Eu(TTA)$_3$phen, wherein phen is 1,10-phenanthroline. Eu(TTA)$_3$phen has strong absorption in the UV range from 250 nm to 400 nm and gives off a strong red emission of 614 nm.

An exemplary Tb complex is Tb(ssal)$_3$, wherein ssal is sulfosalicylic acid. Tb(ssal)$_3$ has strong absorption in the UV range from 250 nm to 360 nm and gives off a strong green emission of 550 nm. An exemplary Sm complex Sm(TTA)$_3$phen, wherein TTA and phen are as described above. Sm(TTA)$_3$phen has strong absorption in the UV range from 250 nm to 400 nm and gives off a red emission of 647 nm and 697 nm.

The down-converters may be added to an encapsulant resin using a melt blending approach and by dispersing the complexes into a polyolefin. For example, the down-converters are typically provided in solid form (i.e., as a fine powder). Various amounts of the rare-earth complexes are incorporated into the encapsulant resin by melt blending using a Haake (Polylab brand) at 60-80 rpm at 200° C. for 10 minutes. However, in further exemplary embodiments, the rare-earth complexes may be added to the encapsulant resins using any process or technique known in the art.

Other Components

Other additives, including additional down-converters, UV stabilizers and compatibilizers may be used in any layer or combination of layers of the multilayer down-converting encapsulant films as disclosed herein. These additives can be incorporated with an encapsulant resin using standard processes and techniques known in the art.

UV stabilizers, compatibilizers and other such additives are known in the art. Additional down-converting materials may include, for example, and are not limited to:

(a) inorganic nanoparticles selected from
  (i) nanoparticle compounds containing photoluminescent lanthanide cations such as La, Ce, Pr, Eu, Nd, Pm, Sm, Tb, Dy, Ho, Er, Tm and Yb;
  (ii) quantum dots selected from the group of semiconductor nanocrystal compounds that can produce more than one exciton from one high energy photon of sunlight, including composites comprising one or more of the nanoparticles (i) or semiconductor nanocrystal compounds (ii) mentioned above having a core-shell structure, the nanoparticles or nanocrystals having a size range from about 1 nm to about 200 nm.; and
  (iii) quantum dots doped with rare-earth metals, especially Yb, such as Yb-doped ZnO quantum dots, QC of Pr$^{3+}$ individual ion activated fluoride- and oxide-based phosphors, and dual/ternary rare-earth ions activated QC phosphors such as Gd$^{3+}$—Eu$^{3+}$, Gd$^{3+}$—Tb$^{3+}$ and Pr$^{3+}$—Mn$^{2+}$ dual ion activated phosphors; and (b) organic luminescent down-converting additives selected from rhodamine, coumarin, rubrene, tris(8-oxoquinoline) aluminum(III) (Alq3), N,N,N',N'-tetraphenylbenzidine (TDP), Gaq2Cl, perylene dye, naphthalene, carbonic acid, violanthrone, iso-violanthrone and derivatives of these additives.

Electronic Devices

Multilayer down-converting encapsulant films such as those described in any above embodiment may be included in an electronic device or other laminated structure. In a preferred aspect of the invention, the multilayer down-converting encapsulant films are used in a PV cell or module.

Generally, PV modules comprise, in sequence, starting from the "top film" which the light initially contacts: (i) a light-receiving and transmitting top sheet or cover sheet film, usually comprising glass, (ii) a front encapsulating film, (iii) PV cells, (iv) a rear encapsulating film, and (v) a back sheet film, usually comprising glass or other polymer film structure back layer substrate. The number of photovoltaic cells in a given electronic device will vary depending on the nature and use of the device.

The films of (i)-(v) of a PV module described above are bonded through lamination. Through lamination, the top sheet is brought in direct contact with the front encapsulating film, and the back sheet is brought in direct contact with the rear encapsulating film. The PV cells are secured between, and in direct contact with, the front and rear encapsulating films.

Multilayer films of the present invention are preferably used in a PV module or other electronic device as a front encapsulating film. The down-converters present in the multilayer down-converting films down-convert the wavelengths of light otherwise unusable or less usable by the PV cells (i.e., 200-550 nm) to usable wavelengths (400-1,000 nm). While films of the present invention may also be used a rear encapsulating films, their use as such will have little or no effect on the PV module.

The rear encapsulating films and back sheet films may be any rear encapsulating film and back sheet film known in the art. For example, rear encapsulants may be polyolefin-based or based on EVA, and back sheet films may include, but are not limited to, polyamide/polyamide/polyamide (AAA) backsheets, poly(vinyl fluoride)/polyethylene terephthalate (PET)/polyamide (TPA) backsheets, fluoropolymer/polyethylene terephthalate/polyamide (FPA) backsheets, polyamide/PET/polyamide (APA) backsheets, Tedlar (or poly(vinyl fluoride))/(PET)/Tedlar (or poly(vinyl floride)) (TPT) backsheets, Kynar (or poly(vinylidene fluoride))/PET/Kynar (or poly(vinylidene fluoride)) (KPK) backsheets, fluoropolymer/PET/fluoropolymer (FPF).

The multilayer down-converting films described herein, including multilayer films having at least two layers and multilayer films having at least three layers, have potential benefit for a wide range of PV cell technologies and are not intended to be limited by the cell material. Generally, cells useful with the films of the present invent have a total useful range from about 400-1,100 nm. For example, cell materials include, but are not limited to, multi-crystalline silicon, mono-crystalline silicon, amorphous silicon, cadmium telluride (CdTe), copper indium gallium selenium (CIGS), copper indium selenium (CIS) and gallium arsenide (GaAs), as well as other materials know in the art which may operate in the 400-1,100 nm range.

EXAMPLES

Preparation of Rare-earth Complex Down-Converter $Eu(TTA)_3phen$

Materials:
  TTA: 4,4,4-trifluoro-1-(2-thienyl)-1,3-butadedione available from TCI Company
  Phen: 1,10-phenanthroline available from Sinopharm Chemical Reagent Company
  EVA: ethylene vinyl acetate (density 0.957 g/cc, melt index 43 g/10 min, melting point 63° C.) available from DuPont as Elvax 150 W 0.446 g (1 mmol) of $Eu(NO_3)_3 \cdot 6H_2O$ is dissolved in 10 ml ethanol and the solution is added slowly into the mixed solution of TTA (0.666 g, 3 mmol) and phen (0.198 mg, 1 mmol) in 20 ml of ethanol under stirring at 70° C. The pH value is adjusted to 6.5-7. The solution is allowed to react for 2 hours. The crystalline precipitate is then collected and dried at 80° C.

Preparation of Multilayer Down-Converting Encapsulant Films

The base resin used in the below examples is ENGAGE 8200 thermoplastic ethylene/1-octene copolymer having a density of 0.870 g/cc as measured by ASTM D792, a melt index (MI) of 5 g/10 min as measured by ASTM D-1238 (190° C./2.16 kg), a melting point of 59° C. as measured by differential scanning calorimetry (DSC), a 2% secant modulus of 1570 psi (10.8 MPa) as measured by ASTM D-790, and a glass transition temperature (Tg) of −53° C. as measured by DSC.

Various amounts of the rare-earth complex $Eu(TTA)_3phen$ prepared above are incorporated into the polymer. The polymer-complex blend is prepared by mixing using a Haake (Polylab brand) at 60-80 rpm at 200° C. for 10 minutes followed by a quick cooling process. The compounded samples are placed in a mold and compressed at 110° C. into a film with a thickness of 0.25 mm. A multilayer encapsulant film having two layers is made by pressing the two layers, both of which are 0.25 mm thick, into one film with a total thickness of 0.5 mm.

Table 1 below shows the composition of the various examples and comparative examples. Encapsulant films with and without down-converters are tested to determine their relative efficiency improvement ($\Delta\eta(\%)$). Efficiency is determined by placing the films on the solar cell and recording the current-voltage (IV) characteristic curve using a Class AAA (AM 1.5 reference spectral irradiance) solar simulator. The percent efficiency (% Eff) is calculated as the maximum power generated by the solar cell (W) divided by the total solar irradiance (1000 W/m² times the solar cell area (m²)). The efficiency is determined for two different solar cells, CIGS and CdTe. The efficiency of CIGS and CdTe with blank ENGAGE 8200 film (0.5 mm thick) is 11.26% and 10.45%, respectively.

TABLE 1

| Sample No. | Layer 1 | Layer 2 | Δη (%) CIGS | Δη (%) CdTe |
|---|---|---|---|---|
| 1* | ENGAGE 8200 | ENGAGE 8200 | 0.00 ± 0.03 | 0 ± 0.02 |
| 2* | EVA | EVA | 0.05 ± 0.02 | 0.03 ± 0.01 |
| 3* | EVA | ENGAGE 8200 | 0.02 ± 0.03 | 0.11 ± 0.01 |
| 4* | ENGAGE 8200 | EVA | 0.07 ± 0.03 | 0.08 ± 0.01 |
| 5 | ENGAGE 8200 + 0.05 wt % Eu(TTA)₃phen | ENGAGE 8200 + 0.05 wt % Eu(TTA)₃phen | 0.09 ± 0.05 | 0.16 ± 0.01 |
| 6 | EVA + 0.05 wt % Eu(TTA)₃phen | EVA + 0.05 wt % Eu(TTA)₃phen | 0.11 ± −.06 | 0.05 ± 0.03 |
| 7 | ENGAGE 8200 + 0.05 wt % Eu(TTA)₃phen | EVA + 0.05 wt % Eu(TTA)₃phen | 0.21 ± 0.01 | 0.29 ± 0.02 |
| 8 | EVA + 0.05 wt % Eu(TTA)₃phen | ENGAGE 8200 + 0.05 wt % Eu(TTA)₃phen | 0.22 ± 0.01 | 0.30 ± 0.01 |
| 9 | ENGAGE + 0.1 wt % Eu(TTA)₃phen | EVA | 0.36 ± 0.04 | 0.41 ± 0.03 |

TABLE 1-continued

Film Compositions and Efficiency Improvement

| Sample No. | Layer 1 | Layer 2 | Δη (%) CIGS | Δη (%) CdTe |
|---|---|---|---|---|
| 10 | EVA | ENGAGE 8200 + 0.1 wt % Eu(TTA)$_3$phen | 0.34 ± 0.04 | 0.35 ± 0.02 |
| 11 | ENGAGE 8200 | EVA + 0.1 wt % Eu(TTA)$_3$phen | 0.26 ± 0.01 | 0.36 ± 0.02 |
| 12 | EVA + 1 wt % Eu(TTA)$_3$phen | ENGAGE 8200 | 0.31 ± 0.05 | 0.45 ± 0.01 |

*denotes comparative example (no down-converters present in any layer)

For further comparison, a single layer encapsulant film of the same thickness (0.5 mm) and with the same total amount of Eu(TTA)$_3$phen is tested. The relative efficiency improvement is shown in Table 2, below.

TABLE 2

Comparison of Examples 11 and 12 to a Single Layer Film with Same Total Complex Loading

| Sample No. | Film Composition | Total Eu(TTA)$_3$phen Loading Level | Δη (%) CIGS | Δη (%) CdTe |
|---|---|---|---|---|
| 13* | ENGAGE 8200 + 0.05 wt % Eu(TTA)$_3$phen | 0.05 wt % | 0.06 ± 0.03 | 0.1 ± 0.03 |
| 11 | Layer 1: ENGAGE 8200<br>Layer 2: EVA + 0.1 wt % Eu(TTA)$_3$phen | 0.05 wt % | 0.26 ± 0.01 | 0.36 ± 0.02 |
| 12 | Layer 1: EVA + 0.1 wt % Eu(TTA)$_3$phen<br>Layer 2: ENGAGE 8200 | 0.05 wt % | 0.31 ± 0.05 | 0.45 ± 0.01 |

*denotes comparative example (monolayer)

As shown, multilayer films with down-converters concentrated in a single layer and at least one layer having no down-converters have higher efficiency than single layer encapsulant films with the same total amount of down-converters. By using multilayer encapsulant films with down-converters in a single layer, or multilayer encapsulant films with down-converters in at least one layer and at least one layer containing no down-converters, the efficiency of PV cell modules is improved and the total cost of down-converter materials can be reduced.

What is claimed is:

1. An electronic device comprising:
a photovoltaic cell; and
an encapsulant film comprising:
a first layer comprising an ethylene vinyl acetate, the first layer being in direct contact with the photovoltaic cell; and
a second layer comprising a copolymer consisting of (i) ethylene monomer and (ii) a $C_{1-12}$ linear or branched alpha-olefin comonomer, the second layer in direct contact with the first layer;
wherein the first layer comprises at least one rare earth organometallic complex selected from the group consisting of an Eu-organometallic complex, a Tb-organometallic complex, and a Sm-organometallic complex, and
wherein the second layer does not contain a rare earth organometallic complex; and
wherein the at least one rare-earth organometallic complex is present in an amount of at least 0.0001 wt %, based on the total weight of the encapsulant film.

2. An electronic device comprising:
a front encapsulant film comprising
a first layer comprising an ethylene vinyl acetate, and
a second layer comprising a copolymer consisting of (i) ethylene monomer and (ii) a $C_{1-12}$ linear or branched alpha-olefin comonomer, the second layer in direct contact with the first layer;
wherein one and only one of the first layer and second layer comprises at least one rare-earth organometallic complex in an amount of at least 0.0001 wt % based on the total weight of the front encapsulant film, the at least one rare-earth organometallic complex is selected from the group consisting of an Eu-organometallic complex, a Tb-organometallic complex, and a Sm-organometallic complex; and
at least one photovoltaic cell, and
the second layer is in direct contact with the at least one photovoltaic cell.

3. The electronic device of claim 2 comprising an increase in absolute module efficiency of greater than 0.05% compared to a comparable electronic device identical to the electronic device except in that the comparable electronic device does not include a rare-earth organometallic complex.

4. The electronic device of claim 2 comprising an increase in absolute module efficiency of at least 0.1% compared to a comparable electronic device identical to the electronic device except in that the comparable electronic device does not include a rare-earth organometallic complex.

5. The electronic device of claim 1, wherein the at least one rare-earth organometallic complex is present in an amount of from 0.01-2 wt % based on the total weight of the encapsulant film.

6. The electronic device of claim 1 further comprising a third layer comprising an encapsulant resin.

7. The electronic device of claim 6, wherein the third layer further comprises at least one rare-earth organometallic complex.

8. The electronic device of claim 2, wherein the second layer includes at least two rare-earth organometallic complexes.

9. The electronic device of claim 1, wherein the at least one rare-earth organometallic complex absorbs UV light having a wavelength of about 200-550 nm.

10. The electronic device of claim 1, wherein the at least one rare-earth organometallic complex emits light having a wavelength of about 400-1,200 nm.

11. The electronic device of claim 2, wherein the at least one rare-earth organometallic complex is present in an amount of from 0.01-2 wt % based on the total weight of the encapsulant film.

12. The electronic device of claim 2 further comprising a third layer comprising an encapsulant resin and the third layer comprises at least one rare-earth organometallic complex.

13. The electronic device of claim 1, wherein the first layer comprises an ethylene vinyl acetate to the exclusion of ethylene/alpha-olefin copolymers.

14. The electronic device of claim 13, wherein the second layer comprises the copolymer to the exclusion of ethylene vinyl acetate.

15. The electronic device of claim 1 wherein the at least one rare earth organometallic complex is selected from group consisting of $Eu(TTA)_3bipy$, wherein TTA is thenoyltrifluoacetone and bipy is bipyridyl, $Eu(TTA)_3phen$ wherein TTA is thenoyltrifluoacetone and phen is 1,10-phenanthroline, $Tb(ssal)_3$ wherein ssal is sulfosalicylic acid, and $Sm(TTA)_3phen$ wherein TTA is thenoyltrifluoacetone and phen is 1,10-phenanthroline.

16. The electronic device of claim 1 wherein the at least one rare earth organometallic complex is $Eu(TTA)_3phen$ wherein TTA is thenoyltrifluoacetone and phen is 1,10-phenanthroline.

17. The electronic device of claim 2 wherein the at least one rare earth organometallic complex is selected from group consisting of $Eu(TTA)_3bipy$, wherein TTA is thenoyltrifluoacetone and bipy is bipyridyl, $Eu(TTA)_3phen$ wherein TTA is thenoyltrifluoacetone and phen is 1,10-phenanthroline, $Tb(ssal)_3$ wherein ssal is sulfosalicylic acid, and $Sm(TTA)_3phen$ wherein TTA is thenoyltrifluoacetone and phen is 1,10-phenanthroline.

18. The electronic device of claim 2 wherein the at least one rare earth organometallic complex is $Eu(TTA)_3phen$ wherein TTA is thenoyltrifluoacetone and phen is 1,10-phenanthroline.

19. The electronic device of claim 18 wherein the $Eu(TTA)_3phen$ is in the first layer.

20. The electronic device of claim 18 wherein the $Eu(TTA)_3phen$ is in the second layer.

* * * * *